(12) United States Patent
Pandey et al.

(10) Patent No.: US 10,896,282 B2
(45) Date of Patent: Jan. 19, 2021

(54) VISUALIZATION PERFORMANCE METRICS OF COMPUTATIONAL ANALYSES OF DESIGN LAYOUTS

(71) Applicant: ASML NETHERLANDS B.V., Veldhoven (NL)

(72) Inventors: Taksh Pandey, Austin, TX (US); Mark Christopher Simmons, Santa Clara, CA (US)

(73) Assignee: ASML Netherlands B.V., Veldhoven (NL)

( * ) Notice: Subject to any disclaimer, the term of this patent is extended or adjusted under 35 U.S.C. 154(b) by 1 day.

(21) Appl. No.: 16/316,465

(22) PCT Filed: Jun. 23, 2017

(86) PCT No.: PCT/EP2017/065593
§ 371 (c)(1),
(2) Date: Jan. 9, 2019

(87) PCT Pub. No.: WO2018/010940
PCT Pub. Date: Jan. 18, 2018

(65) Prior Publication Data
US 2019/0294753 A1 Sep. 26, 2019

Related U.S. Application Data

(60) Provisional application No. 62/361,055, filed on Jul. 12, 2016.

(51) Int. Cl.
*G06F 17/50* (2006.01)
*G06F 30/398* (2020.01)
(Continued)

(52) U.S. Cl.
CPC .............. *G06F 30/398* (2020.01); *G03F 1/36* (2013.01); *G03F 7/70433* (2013.01); *G03F 7/70441* (2013.01)

(58) Field of Classification Search
USPC .......................... 716/50, 51, 52, 53, 54, 55
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |

(Continued)

FOREIGN PATENT DOCUMENTS

| | | |
|---|---|---|
| JP | 2007233456 | 9/2007 |
| KR | 20050061498 | 6/2005 |

(Continued)

OTHER PUBLICATIONS

International Search Report dated Nov. 15, 2017, issued in corresponding International Application PCT/EP2017/065593.

(Continued)

*Primary Examiner* — Brian Ngo
(74) *Attorney, Agent, or Firm* — Pillsbury Winthrop Shaw Pittman LLP

(57) ABSTRACT

A process, including: obtaining data specifying a layout of a lithographic pattern; obtaining performance metrics of a computational analysis of the layout, the performance metrics indicating performance of one or more computer processes performing respective portions of the computational analysis; correlating the performance metrics to portions of the layout processed during measurement of the respective performance metrics; and generating a three or higher dimensional visualization based on a result of correlating the performance metrics to portions of the layout processed during measurement, wherein at least some of the visualization dimensions indicate relative positions of portions of the layout and at least some of the visualization dimensions indicate a performance metric correlated to the respective portions.

20 Claims, 13 Drawing Sheets

(51) Int. Cl.
*G03F 1/36* (2012.01)
*G03F 7/20* (2006.01)

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,444,610 | B1 | 10/2008 | Carreira et al. |
| 7,587,704 | B2 | 9/2009 | Ye et al. |
| 10,126,237 | B2 | 11/2018 | Van Der Zouw |
| 2009/0144042 | A1* | 6/2009 | Lorenz ............ G06F 30/20 703/14 |
| 2009/0157360 | A1 | 6/2009 | Ye et al. |
| 2009/0217224 | A1* | 8/2009 | Wiaux ............ G03F 1/44 716/106 |
| 2011/0197169 | A1 | 8/2011 | Herold |
| 2012/0262472 | A1 | 10/2012 | Garr et al. |
| 2013/0121612 | A1 | 5/2013 | Falco, Jr. et al. |
| 2013/0179847 | A1 | 7/2013 | Hansen |
| 2013/0232164 | A1 | 9/2013 | Bigney et al. |
| 2013/0326437 | A1 | 12/2013 | Liu et al. |
| 2014/0358830 | A1 | 12/2014 | Chiang et al. |
| 2015/0170616 | A1 | 6/2015 | Corpet et al. |
| 2015/0228095 | A1 | 8/2015 | Chen et al. |
| 2015/0379188 | A1 | 12/2015 | Kahng et al. |
| 2016/0117194 | A1 | 4/2016 | Bostic et al. |
| 2016/0140267 | A1* | 5/2016 | Chen ............ G03F 7/705 716/55 |
| 2017/0329235 | A1 | 11/2017 | Hsu et al. |
| 2017/0365100 | A1* | 12/2017 | Walton ............ G06T 19/006 |

FOREIGN PATENT DOCUMENTS

| | | |
|---|---|---|
| KR | 20150024871 | 3/2015 |
| TW | 201602717 | 1/2016 |
| TW | 201617729 | 5/2016 |
| TW | 201617743 | 5/2016 |
| WO | WO 2015/189026 | 12/2015 |

OTHER PUBLICATIONS

Office Action dated Apr. 20, 2018, issued in corresponding Taiwanese Patent Application No. 106121048.

Shimon Maeda et al., "HotSpot Detection using Image Pattern Recognition based on Higher-order Local Auto-Correction", Proc. of SPIE vol. 7974, No. 1, Mar. 17, 2011, pp. 79740X-1-79740X10.

Siew-Hong Teh et al., "Design-Process Integration for Performance-based OPC Framework", Design Automation Conference: DAC, Jun. 8, 2008, pp. 522-527.

Amr Abdo et al., "The comparison of OPC performance and run time for dense versus sparse solutions", Proc. of SPIE, vol. 6924, Mar. 14, 2008, pp. 69243G1-69243G-10.

Ryo Tsujimura et al., "Mask data processing technique using GPU for reducing computer cost", Proc. of SPIE, vol. 8081, Apr. 29, 2011, pp. 808101-1-808101-14.

Korean Notice of Allowance issued in corresponding Korean Patent Application No. 10-2019-7004000, dated Oct. 18, 2020.

* cited by examiner

VISUALIZATION PERFORMANCE METRICS OF COMPUTATIONAL ANALYSES OF DESIGN LAYOUTS

CROSS-REFERENCE TO RELATED APPLICATIONS

This application is the U.S. national phase entry of PCT patent application no. PCT/EP2017/065593 which was filed on Jun. 23, 2017, which claims the benefit of priority of U.S. provisional application No. 62/361,055, which was filed on Jul. 12, 2016, and which is incorporated herein in its entirety by reference.

BACKGROUND

Field

The present disclosure relates generally to computational analyses of lithographic processes and, more specifically, to visualizing performance metrics of computational analyses of design layouts.

Description of the Related Art

A variety of computational techniques are used to analyze and adjust lithographic design layouts, such as mask layouts for photolithography, or layouts for e-beam lithography equipment. In many cases, these techniques are applied before committing to a production version of the layout, e.g., before creating a mask with the layout, so that the mask can be improved through simulation before the relatively expensive and time consuming process of writing the mask. Examples include various forms of electronic design automation tools, such as design-rule checking applications, optical proximity correction (OPC) applications, OPC verification applications, applications that fracture designs into formats suitable for mask writing equipment, process window optimization applications, and applications that analyze multi-project masks.

SUMMARY

The following is a non-exhaustive listing of some aspects of the present techniques. These and other aspects are described in the following disclosure.

Some aspects include a process, including: obtaining data specifying a layout of a lithographic pattern; obtaining performance metrics of a computational analysis of the layout, the performance metrics indicating performance of one or more computer processes performing respective portions of the computational analysis; correlating the performance metrics to portions of the layout being processed during measurement of the respective performance metrics; and generating a three or higher dimensional visualization based on a result of correlating the performance metrics to portions of the layout being processed during measurement, wherein at least some of the visualization dimensions indicate relative positions of portions of the layout and at least some of the visualization dimensions indicate a performance metric correlated to the respective portions.

Some aspects include a tangible, non-transitory, machine-readable medium storing instructions that when executed by a data processing apparatus cause the data processing apparatus to perform operations including the above-mentioned process.

Some aspects include a system, including: one or more processors; and memory storing instructions that when executed by the processors cause the processors to effectuate operations of the above-mentioned process.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
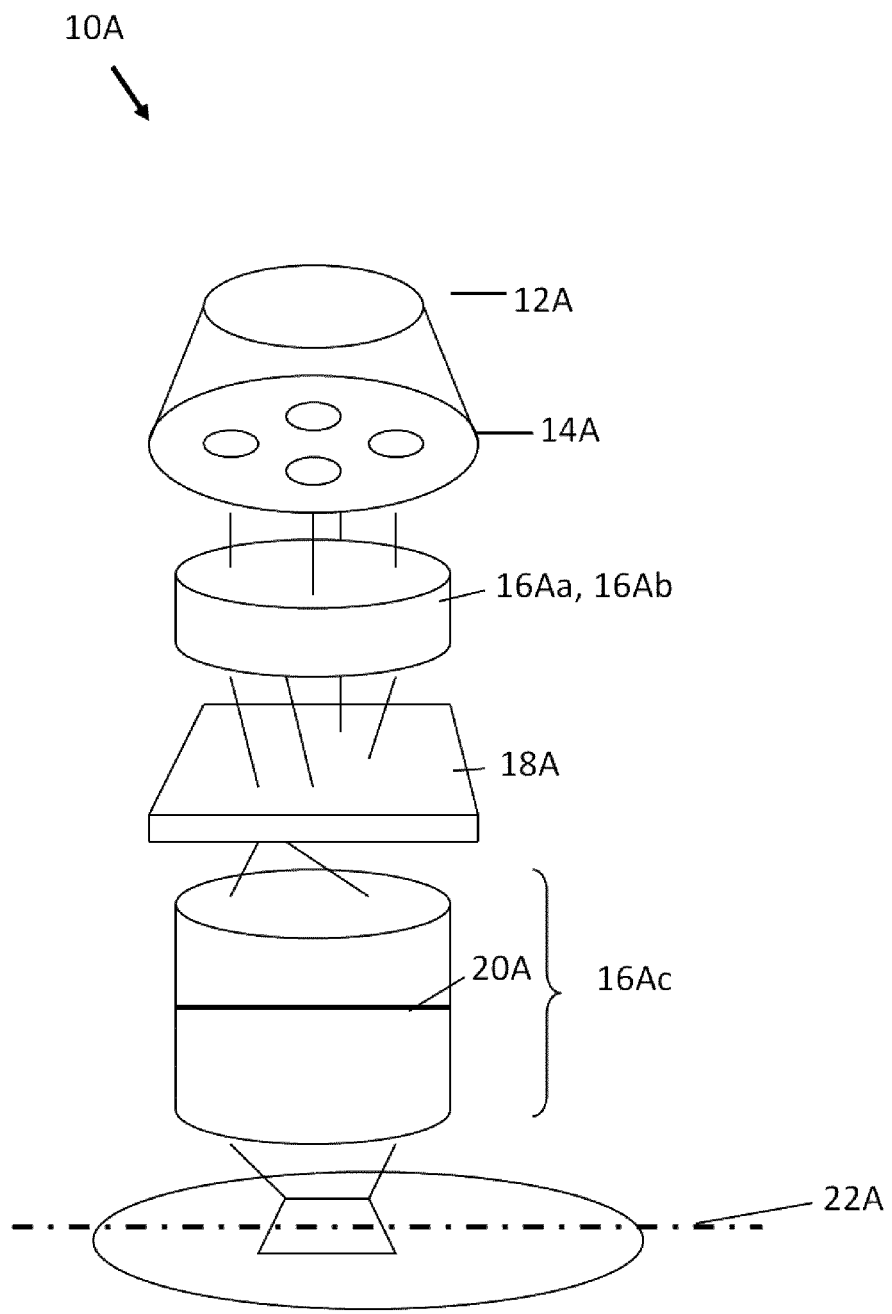
FIG. 1 is a block diagram of a lithography system.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of computational analysis of design layouts. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

In many cases, runtimes for computational analyses of design layouts are relatively long. For instance, typical analyses take around 24 to 120 hours when run on around 2,000 processor cores. Often a given product, such as an integrated circuit, has more than 20 layers, and each of these layers may include a pattern subject to one or more iterations of this analysis. The issue is compounded in foundries, where a given fab manufactures a relatively large number of different integrated circuits, each having many layers subject to these relatively time-intensive analyses. Consequently, substantial effort is frequently expended expediting and otherwise tuning the analyses.

Often runtimes for a design layout analysis is particularly slow, and engineers typically respond by attempting to troubleshoot the process. Potential sources of delays are numerous and can include mistuned configurations of the simulation, problems with the data structure encoding the layout, problems with the network by which a compute cluster running the analysis communicates, and problems with the computing nodes on the compute cluster. Diagnosing problems is made particularly challenging by distributed and uncorrelated data indicative of performance of the analysis among the nodes of the cluster and other systems. In many cases, such data is difficult to correlate in ways that reveal root causes of slow or otherwise problematic analyses.

To mitigate these problems, or in some cases other challenges, some embodiments generate a heat-map of various performance metrics according to position on a layout of a design being analyzed. It has been discovered that many delays in computational analyses are pattern dependent and arise from aspects of a layout. The heat maps (and other higher dimensional visualizations revealing correlations between location in a layout and performance metrics) are expected to indicate many common root causes of slow runtimes and other issues and facilitate faster troubleshooting of computational analyses of design layouts.

These techniques are best understood in view of an example of a type of patterning process by which a design layout may be patterned on a substrate, as many of the computational analyses are designed to mitigate biases and other artifacts potentially otherwise introduced in this process.

A lithographic projection apparatus can be used, for example, in the manufacture of integrated circuits (ICs). In such a case, a patterning device (e.g., a mask) may specify a pattern corresponding to a layer of the IC ("design layout"), such as a via layer, an interconnect layer, or gate layer, or the like. This pattern, often forming part of a circuit, may be transferred onto a target portion (e.g. one or more dies in an exposure field) on a substrate (e.g., a silicon wafer) that has been coated with a layer of radiation-sensitive material (e.g., "resist"). Transfer techniques include irradiating the target portion through the circuit pattern on the patterning device. Often, a single substrate contains a plurality of adjacent target portions to which the circuit pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device may be transferred to one target portion progressively. Often, the lithographic projection apparatus will have a magnification factor M (generally <1), so the speed F at which the substrate is moved will be a factor M times that at which the projection beam scans the patterning device. More information about examples of some lithographic devices are described, for example, by U.S. Pat. No. 6,046,792, incorporated herein by reference.

A variety of processes may occur before and after exposure. Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation or diffusion (doping), metallization, oxidation, chemical-mechanical polishing, etc., to form a layer of the device. If several layers are required in the device, then variations on this procedure may be repeated for each layer, often with a different pattern specified by a different patterning device at each layer. Eventually, a device may be formed in each target portion on the substrate. These devices may then be separated from one another by a technique such as dicing or sawing, whence the individual devices can be mounted on a carrier, connected to pins, ball-grid arrays, etc. Or some embodiments may encapsulate devices before simulation.

As noted, lithography is a step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law." Often, layers of devices are manufactured using lithographic projection apparatuses that project a design layout onto a substrate using illumination from a deep-ultraviolet illumination source, creating individual functional elements having dimensions well below 100 nm, i.e., less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1 \times \lambda/NA$, where $\lambda$ is the wavelength of radiation employed (often 248 nm or 193 nm for photolithography), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance.

To overcome these difficulties, fine-tuning steps are often applied to the lithographic projection apparatus or design layout. These include, for example, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. Examples of "projection optics" include components operating according to any of these design types for directing, shaping or controlling the projection beam of radiation, collectively or singularly. Examples of "projection optics" include optical components in a lithographic projection apparatus, no matter where the optical component is located on an optical path of the lithographic projection apparatus. Projection optics may include optical components for shaping, adjusting or projecting radiation from the source before the radiation passes the patterning device, or optical components for shaping, adjusting or projecting the radiation after the radiation passes the patterning device. The projection optics generally exclude the source and the patterning device.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle," "wafer," or "die" in this text should be considered as interchangeable with the more general terms "mask," "substrate," and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). In some embodiments, examples of "radiation" and "beam" also include electrical radiation, such as electron beams or ion beams, by which patterns are transferred.

The term "optimizing" and "optimization" as used herein refers to or means adjusting a lithographic projection apparatus, a lithographic process, etc. such that results or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g., a local optimum, in at least one relevant metric, compared to an initial set of one or more values for those one or more parameters. These terms do not require identifying a global optimum and can encompasses improvements short of a global optimum. In an embodiment, optimization steps can be applied iteratively to provide further improvements in one or more metrics. Steps in which an error function or loss function is minimized (e.g., reduced to, or at least closer to, a minimum) in an optimizing process should be read as generic to steps in which signs are reversed and a fitness function is maximized (e.g., increased to, or at least closer to, a maximum), and vice versa.

In some embodiments, the lithographic projection apparatus may be of a type having two or more tables (e.g., two or more substrate table, a substrate table and a measurement table, two or more patterning device tables, etc.). In such "multiple stage" devices a plurality of the multiple tables may be used concurrently, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above may specify some or all of one or more design layouts (e.g., a portion of a design layout for double-patterning, or an entire layout). The design layout can be generated using CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit elements (such as gates, capacitors, etc.), vias, or interconnect lines, so as to reduce the likelihood of the circuit devices or lines interacting with one another in a material, undesirable way. One or more of the design rule limitations may be referred to as "critical dimensions" (CD). A critical dimension of a circuit, in some contexts, refers to the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" refers to a device that can be used to endow an incoming radiation beam with a patterned cross-section (which may unfold over time, e.g., in scanning or electron-beam lithography), corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Non-optical patterning devices include an electron beam modulator coupled to a data source for a design layout and configured to spatially modulate the beam according to the layout. Other examples include a mold for imprint lithography and an inkjet printer, e.g., with electrically conductive or insulative ink.

As a brief introduction, FIG. 1 illustrates an example of a lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin (Omax), n is the Index of Refraction of the media between the last element of projection optics and the substrate, and Omax is the largest angle of the beam exiting from the projection optics that can still impinge on the substrate plane 22A. The radiation from the radiation source 12A may not necessarily be at a single wavelength. Instead, the radiation may be at a range of different wavelengths. The range of different wavelengths may be characterized by a quantity called "imaging bandwidth," "source bandwidth" or simply "bandwidth," which are used interchangeably herein. A small bandwidth may reduce the chromatic aberration and associated focus errors of the downstream components, including the optics (e.g., optics 14A, 16Aa and 16Ab) in the source, the patterning device and the projection optics. However, that does not necessarily lead to a rule that the bandwidth should never be enlarged.

In an optimization process of a patterning process using a patterning system, a figure of merit of the system can be represented as a cost function. The optimization process may include finding a set of parameters (e.g., design variables and parameter settings) of the system that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (e.g., worst deviation). "Evaluation points" may include any characteristics of the system, depending on the context. The design variables of the system can be confined to finite ranges and may be interdependent due to practicalities of implementations of the system. In the case of a lithographic projection apparatus, the constraints are often associated with physical properties and characteristics of the hardware such as tunable ranges, or patterning device manufacturability design rules, and the evaluation points can include physical points on a resist image on a substrate, as well as non-physical characteristics such as dose and focus.

In some examples of a lithographic projection apparatus, a source provides illumination (or other types of radiation) to a patterning device and projection optics direct and shape the illumination, via the patterning device, onto a substrate. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related to properties of the resist layer (e.g., only to these properties) (e.g., effects of chemical processes which occur during exposure, PEB and development). Optical properties of the lithographic projection apparatus (e.g., properties of the source, the patterning device and the projection optics) may dictate the aerial image. Since the patterning device used in the lithographic projection apparatus can be changed in some embodiments, it is often desirable to separate the optical properties of the patterning device from the optical properties of the rest of the lithographic projection apparatus including at least the source and the projection optics.

Figure 2:
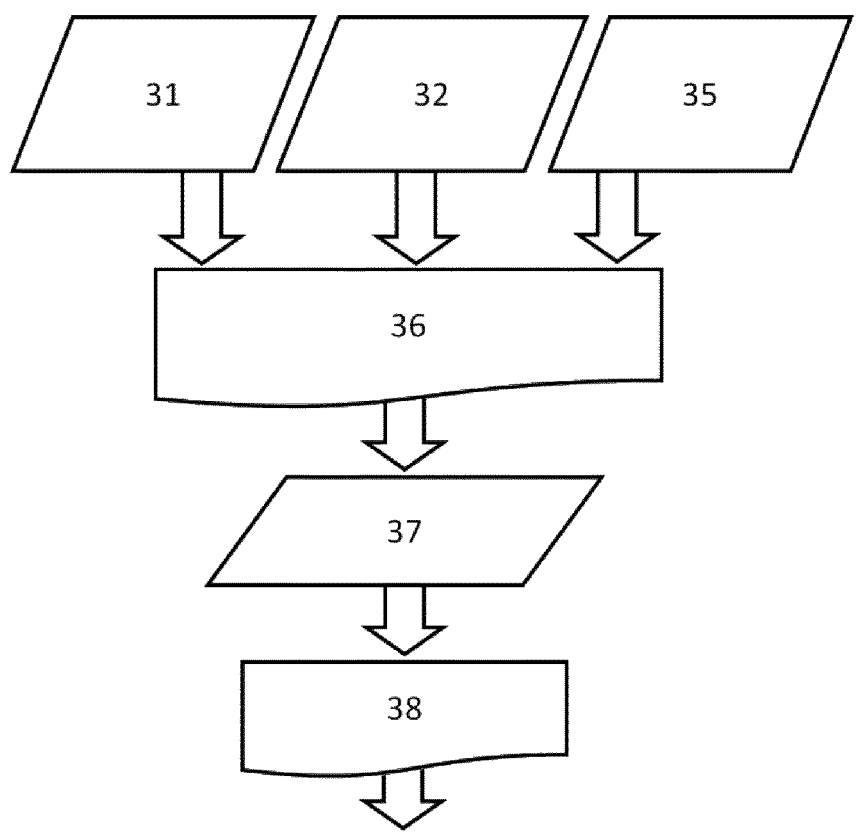
FIG. 2 is a block diagram of a pipeline of simulation models of patterning processes.

An exemplary pipeline for simulating patterning and subsequent subtractive processes is illustrated in FIG. 2. In this example, a source model 31 represents optical characteristics (including radiation intensity distribution, bandwidth and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image. In some embodiments, the simulation may yield spatial dimensions of simulated patterned structures formed on a simulated substrate by a simulated process, such as line-widths, sidewall taper or curvature, via diameters, fillet radii, chamfer radii, surface roughness, internal stress or strain, overlay, etc.

In some embodiments, the source model 31 may represent the optical characteristics of the source that include, for example, NA settings, sigma (0) settings as well as any particular illumination shape (e.g. off-axis radiation sources such as annular, quadrupole, dipole, etc.). The projection optics model 32 may represent the optical characteristics of the projection optics, including aberration, distortion, one or more refractive indexes, one or more physical sizes, one or more physical dimensions, etc. The design layout model 35 may represent one or more physical properties of a physical patterning device, as described, for example, in U.S. Pat. No. 7,587,704, which is incorporated by reference in its entirety. The objective of the simulation is to predict, for example, edge placement, aerial image intensity slope or CD, which can then be compared against an intended design. The intended design is generally defined as a pre-OPC (optical proximity corrected) design layout which can be provided in a standardized digital file format such as GDSII or OASIS or other file format.

In some embodiments, the pipeline of FIG. 2 may be executed by one or more of the computers described below with reference to FIG. 9, e.g., in a compute cluster described with reference to FIG. 4. In some embodiments, the pipeline of FIG. 2 may be used to augment a reticle with both optical proximity correction and etch-assist features. Software tools for computational analyses of design layouts are available from ASML Brion Company of 399 W Trimble Rd, San Jose, Calif. 95131, USA, such as software for optical proximity correction, process-window optimization, or source-mask optimization, like Brion's Tachyon line of products.

Figure 3:
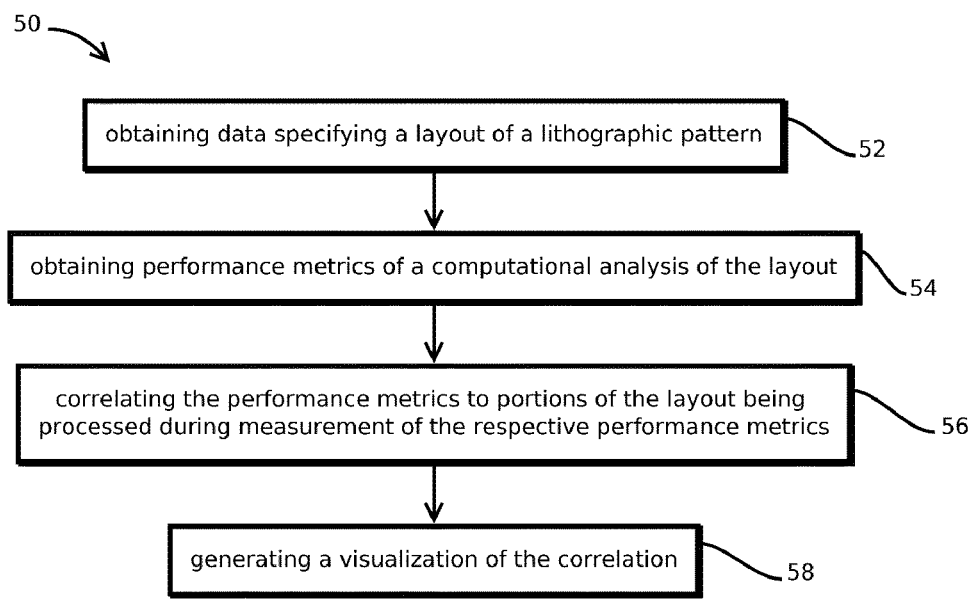
FIG. 3 is a flowchart of an example of a process that forms graphical visualizations of performance metrics of computational analyses of design layouts.

FIG. 3 is a flow chart showing an example of a process 52 generate a visualization to troubleshoot correlations between lithographic patterns and performance of computational analyses of those patterns. Generating a visualization may include displaying the visualization, or generating a visualization may be accomplished by forming the data and instructions by which such a display is formed, e.g., data and instructions sent to a remote thin client device on which the visualization is displayed. In some embodiments, the steps of process 50 (and other computer processes herein) may be encoded as computer program instructions on a tangible, non-transitory, machine-readable medium, such that when the instructions are executed by a data processing apparatus, like a computer, the operations described are effectuated. In some embodiments, certain operations of process 50 may be supplemented, omitted, executed in a different sequence, or executed concurrently in multiple instances, which is not to suggest that any other feature herein is not also amenable to variation.

In some embodiments, the process 50 may be executed by a computer system, such as a computer system of an analysts interfacing with the system described below with reference to FIG. 4 for performing computational analyses on design layouts with clusters of computers. In some cases, the process 50 may be executed after completing such an analysis (or during the analysis), for example, to troubleshoot why the analysis was particularly slow or why particular portions of the analysis were relatively taxing on available computing resources. In some embodiments, the process 50 may be executed during an analysis, e.g., periodically, or in response to completing portions of the analysis or in response to a request by a user for an updated visualization. In some embodiments, a technician may monitor or otherwise access a visualization produced with process 50 during an analysis to troubleshoot an ongoing analysis. For instance, metrics may indicate that the analysis is proceeding more slowly than expected, and in response, a technician may request a visualization produced with process 50 to diagnose the slow behavior. A technician may observe an excess of "hot spots" in such a visualization that suggest remedial action, and the technician may determine whether to adjust a configuration or terminate an analysis to expedite operations.

In some embodiments, the process 50 begins with obtaining data specifying a layout of a lithographic pattern, as indicated by block 52. In some cases, the layout is a layer of an integrated circuit, an optical device, a magnetic storage device, a micro-electro-mechanical device, or the like, fabricated with semiconductor manufacturing technology, for instance, in a fab. For example, the layout may specify a layer of metal interconnects, a layer of vias, a layer of polysilicon local interconnects, a layer of transistor gates, or active areas corresponding to transistors. In some embodiments, the lithographic pattern may undergo a pipeline of analyses and transformations based on the analyses (the transformed design layout still constitution a type of design layout), for example, obtaining a GDSII file, performing optical proximity correction, fracturing layouts, verifying layouts, and the like. In some embodiments, during or at the end of this pipeline, the layout may be uploaded to a mask writing tool to create a mask that may be used with the lithography equipment described below to pattern a layer on a substrate and form one or more devices on the substrate. In many cases, the pattern may be relatively intricate and detailed, for example, corresponding to a layer of an integrated circuit having more than 1 billion transistors and features smaller than 20 nm in some cases.

In some embodiments, the design layout may be organized in a variety of different formats. For example, the design layout may be organized in a hierarchical arrangement, in which repeated patterns are explicitly labeled as such, or in a flat arrangement. In some embodiments, the design layout may be subdivided into patches, such as tiles, like square two-dimensional areas of the pattern grouped together for purposes of processing the features in the group together, like on a single processor core or a set of processes on a set of cores in a compute cluster. In some cases, the patches may be relatively small, for example, on the order of 50 square microns ($\mu m^2$), 30 $\mu m^2$, or 20 $\mu m^2$, or less. In some cases, the patches may be quantized unit areas of the pattern having the same shape and size throughout the pattern, or in some cases, the patches may be varied in shape or size, for example, according to the density of the features of the pattern, with larger patches corresponding to lower densities. In some cases, the patches may include a collection of segments of the pattern, like edges, lines, corners, vias, and the like, that collectively constitute the portion of the pattern in the patch. In some cases, the segments may be encoded as a collection of finer resolution features, like polygons in a mesh or unit squares in a grid. The design layout may indicate both the shape of the features and their relative position and orientation.

In some cases, obtaining the data specifying a layout of a lithographic process may include executing an analysis of that data. In some cases, the analysis may be a computational analysis that warrants troubleshooting, and that troubleshooting effort may potentially benefit from graphical visualizations produced by the process 50. For example, the computational analysis may include performing optical proximity correction of the lithographic pattern, for instance, by ingesting a target design layout, and outputting an optical proximity corrected version of the layout that counteracts various biases and pattern dependent interactions arising from the lithographic process. In some embodiments, the analysis may be a design rule check of the design layout according to a set of design rules specified by a manufacturer. In some embodiments, the analysis may be a tool for fracturing designs into a format suitable for mask writing equipment. In some embodiments, the analysis may include analyzing multichip design layouts.

As noted above, many such analyses are relatively slow and computationally intensive tasks. An example of a compute cluster configured to perform such analyses is illustrated in a block diagram of FIG. 4. The illustrated compute cluster 60 includes a master server 62, a network 64, and a collection of leaf servers 66, each writing log files 68 indicative of tasks performed by the respective leaf server 66 and performance of computing hardware associated with the respective leaf server 66. In some cases, the compute cluster 60 may be implemented in a data center, with the network 64 being a local area network. In some embodiments, the compute cluster 60 may include a relatively large number of central processing units, like more than 100 cores, more than 1000 cores, and in many commercially relevant implementations, more than 2000 or more than 4000 cores, in some cases with each respective core executing a distinct process in the analysis.

In some embodiments, an analysis of the layout may be expedited by assigning subsets of the layout to different processes of the compute cluster 60, such as differently servers executing different threads. For example, the master server 62 may assign tasks to the various leaf servers 66, coordinate their operation, and aggregate their results in many cases via the network 64. In some embodiments, the above-described patches may serve as a subset unit of the design layout assigned to different respective processes, such as different processes executing on different leaf servers 66.

Figure 5:
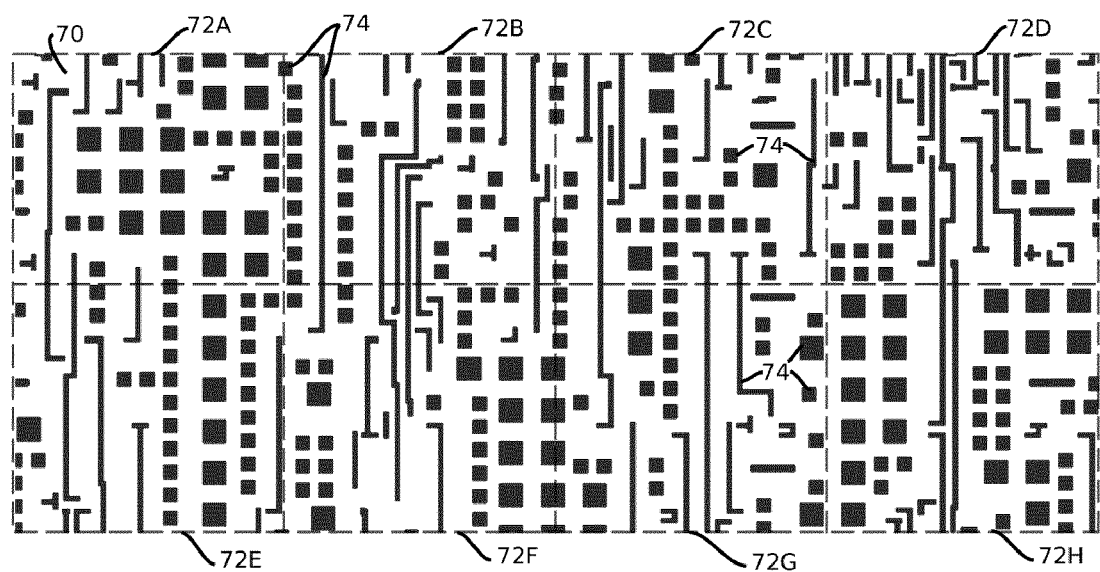
FIG. 5 is an example of a portion of a design layout subject to computational analysis.

FIG. 5 illustrates an example of a design layout 70 including a plurality of patches 72A through 72H. Each of the patches may include a variety of segments 74 that correspond to places on a substrate where either material will be removed or material will be left in place depending upon the type of lithographic process. Thus, the layout 70 may specify the resulting structures in a layer of a device fabricated with semiconductor process technology. In some embodiments, the above-described analyses may depend upon the shape, relative positioning, and interaction between the various segments 74, which in many commercial implementations are expected to be substantially more complex and intricate than that illustrated in FIG. 5. In some embodiments, the segments in each of the patches 72A-72H may be processed together on a respective leaf server, e.g., with different leaf servers analyzing different patches. For example, the master server 62 may assign patches to respective servers and data specifying the segments in those respective patches may be sent to the respectively servers, which may return resulting analyses pertaining to those patches. In commercial implementations, the number of patches is expected to be relatively large, for example, for a pattern exceeding 10 mm×10 mm, and a patch size of 30 µm, square, the number of patches is expected to number over 100,000. In some cases, some patches may include more detailed and feature-rich collections of segments, while other patches may be relatively sparsely populated. Similarly, some patches may contain relatively repetitive collections of segments that are amenable to relatively fast processing, while other patches may include irregular arrangements or patterns that are particularly computationally intensive to analyze. Thus, in some cases, different patches may be processed at different times on different leaf servers. In some cases, each patch may be associated with a patch identifier unique within the layout, in some embodiments along with a description of the boundaries of the patch in the layout.

Figure 4:
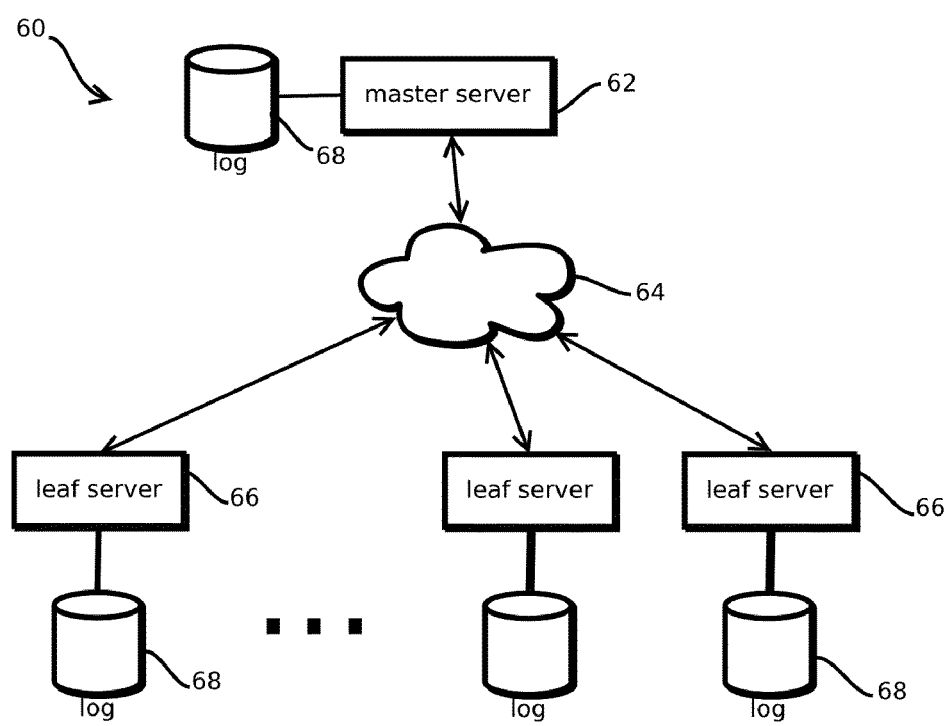
FIG. 4 is a block diagram of an example of a compute cluster that performs computational analyses of design layouts.

As the compute cluster of FIG. 4 analyzes the layout 70, the compute cluster 60 may generate two types of output data: results of the analysis, and performance metrics. In some cases, the results of the analysis is the transformation or labeling of the layout, such as an optical proximity corrected version of the layout, or labeling of subsets of the layout as containing errors or design rule violations. In some cases, the outputs of the various servers 62 and 68 include detailed activity reports, such as log files. In some embodiments, the performance metrics take a variety of forms. Examples include algorithmic performance metrics indicating an amount of time a respective routine or subroutine of the analysis takes to execute or an amount of memory consumed by the respective routine or subroutine during execution, like peak memory usage or average memory usage. In some cases, the performance metrics may indicate such measures on a patch-by-patch basis or a segment-by-segment basis. In some embodiments, the routine executing the analysis may cause the leaf server 66 to write the algorithmic performance metrics to a log 68, such as an process-specific log file including a plurality of performance metrics records, each record including a timestamp of when the performance metric was obtained (such as a start and stop time of a routine), an identifier of the routine or subroutine (e.g., in an analysis pipeline), an indicator of memory consumed (like peak or average memory consumption), and a unique identifier of a respective portion of the layout being analyzed when the performance metric was measured, like a unique identifier of a patch or segment. In some cases, the master server 62 may also emit a log file 68 with these attributes. In some embodiments, performance metrics may also be extracted from log files or other records of various other platforms, like a cluster resource management system, such as Load Sharing Facility (LSF) and Sun Grid Engine (SGE) of Oracle Sun Grid, available from Oracle Corp. of Redwood Shores, Calif. Thus, in some cases, the log file may include a list of patches and runtimes for each of the patches that were analyzed on a particular leaf server 66.

The log files may also include computer hardware performance metrics, like processor utilization measurements, memory consumption measurements, network bandwidth usage measurements, memory latency measurements, memory bandwidth usage measurements, network latest latency measurements, network bandwidth measurements, measures of dropped packet rates, CPU temperature, and the like. In some cases, the hardware log files may be recorded by different process from the processes executing the analyses on the patches, and in many cases, multiple processes may be executing on a single leaf server analyzing different patches of a design or different patches of different designs.

In some embodiments, the computer hardware log files do not include identifiers of patches or segments (or other indicators of what portion of a design is being processed at the time of measurement), though embodiments are consistent with hardware log files that do include identifiers of patches being analyzed at the time the hardware performance metrics were measured. In some embodiments, the hardware performance metrics are each associated with timestamps indicating a time at which the hardware performance metric was measured, in some cases with an associated identifier of the particular leaf server 66. Similarly, in some embodiments, the master server 62 may generate a similar set of log files indicative of both algorithmic performance of routines on the master server and hardware performance. Thus, some embodiments may yield a distributed, diverse, and relatively large collection of log files, some of which contain performance metrics that are not correlated with any particular patch or segment of the design layout.

In some embodiments, it is from this diverse and a distributed set of log files that the process 50 of FIG. 3 may obtain performance metrics of a computational analysis of the layout, as indicated by block 54. In some cases, some embodiments may execute a routine, such as an agent on each of the leaf servers 66 that reports the log files to a central repository, such as a process executed by the master server configured to parse the log files and populate a relational database for subsequent analysis. In some embodiments, this may include consolidating algorithmic log files and computing hardware log files corresponding to the number of cores described above. In some embodiments, this process may include parsing performance metrics from the log files or calculating performance metrics, for instance, by calculating differences between timestamps to determine runtimes or extracting particular measures of interest.

Next, some embodiments may correlate the performance metrics to portions of the layout being processed during measurement of the respective performance metrics, as indicated by block 56. Correlating may take a variety of different forms. Examples include accessing an extant correlation, e.g., by accessing key-value pairs in memory that directly associate such metrics with portions of the layout. Or some embodiments correlate by forming direct associations from indirect associations, e g, linking performance metrics to portions of the layout by timestamps indicating that metrics were measured at the time portions were processed. In some embodiments, this operation may include creating an index by patch identifier (e.g., a unique identifier within the layout) or segment identifier where a key of the index is the respective identifier, and the index returns performance metrics associated with that respective patch or segment. For example, some embodiments may associate with each patch or segment a runtime of the analysis or a plurality of runtimes each associated with a different respective portion of the analysis pertaining to that patch or segment. For example, if a particular process on a particular leaf server 66 takes 10 seconds to analyze a given patch 72A, while a different process on a different leaf server 66 takes 10 minutes to analyze a different patch 72B, this information may be reflected in the correlation, and the relationships may be made explicit.

In some embodiments, correlating the performance metrics to portions of the layout may include correlating performance metrics in log files that do not include patch identifiers to the patch identifier of the patch being processed when the performance metrics were measured. Some embodiments may extract timestamp and patch identifier pairs from algorithmic log files to identify ranges of time in which a given patch identifier was being processed on a given process on a given computer. Some embodiments may then designate performance metrics in hardware log files having timestamps in the same range as pertaining to the associated patch identifier. Or some embodiments may perform a similar technique with respective segment identifiers. Thus, some embodiments may obtain for each patch or segment identifier, a set of performance metrics including both algorithmic and hardware performance metrics.

Next, some embodiments may generate a visualization of the correlation, as indicated by block 58 of FIG. 3. In some embodiments, the visualization may be a heat map that visually correlates values of performance metrics pertaining to portions of the layout to those portions of the layout. In some embodiments, the visualization may be a three or higher dimensional visualization, where two of the dimensions are spatial dimensions indicating the relative position of portions of the layout to which the metrics pertain. In some embodiments, the third dimension may indicate a value of the performance metric.

Figure 6:
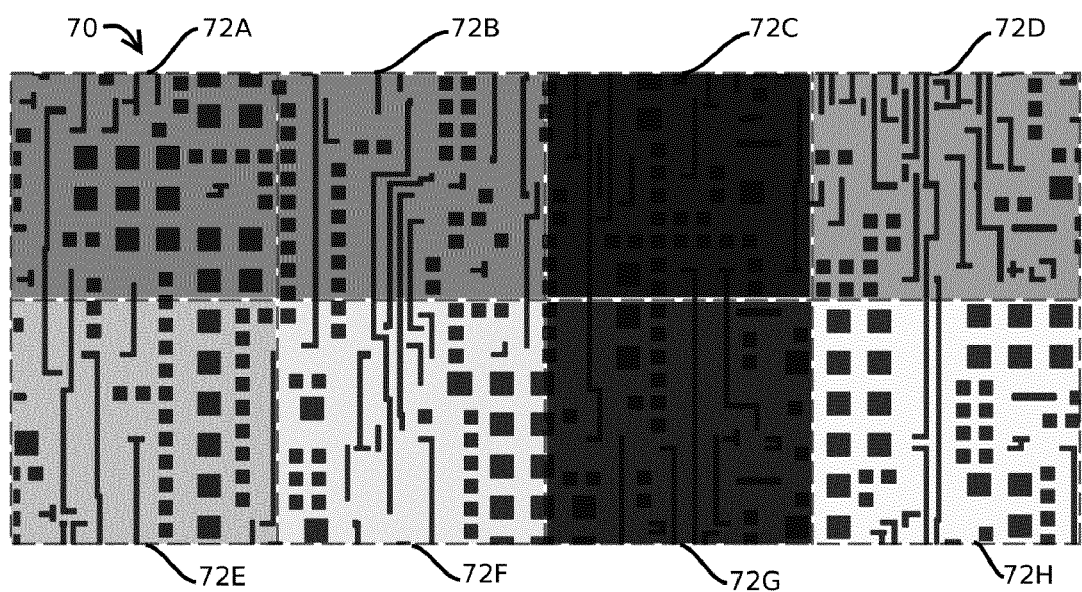
FIG. 6 is an example of a heat-map visualization of performance metrics characterizing computational analysis of the design layout of FIG. 5.

An example is shown in the heat-map 74 of FIG. 6. In this example, the portions of the layout are grouped for visualization purposes according to the patches 72A-72H, with the performance metrics being indicated by a shading of the area corresponding to the patch. In this example, a uniform shading is applied to the entire respective patch corresponding to aggregate performance metrics for the patch, like runtime for the particular patch. In some cases, particular patches, like 72C, took a relatively long time to run, may be designated with a darker shading, while other patches, like patch 72H, executed relatively quickly, and as a result, may have a relatively light color. Patches with an intermediate shading, like 72A or 72B may have intermediate runtimes. A similar technique may be applied to a variety of different performance metrics. Similarly, other divisions of the layout may be similarly labeled, such as on a segment-by segment basis. For instance, some embodiments may log performance metrics indicative of the contribution of individual segments to portions of an analysis, and those segments may be labeled with various corresponding visual attributes in a visualization.

The illustrated heat-map 74 represents the third dimension in terms of grayscale shade, but embodiments are consistent with a variety of other visual attributes that may be modulated to indicate the third dimension. Examples include color (like ranging between blue and red), saturation, tint, transparency, crosshatching, and the like, each of which may be modulated according to the performance metric at issue pertaining to the region to which the modulated appearance is applied.

In some embodiments, the performance metrics may be adjusted to make the visualization more informative, e.g., in response to a user request to apply a particular adjustment. For example, some embodiments may normalize the performance metrics, such as by normalizing those performance metrics depicted in a particular field of view, or by normalizing performance metrics across the entire layout. In some cases, normalizing the performance metrics may include scaling the performance metrics to fit within some predefined range, like 0 to 1, or 0 to 10, and mapping values within that range to visual attributes, like color, shading, transparency, and the like. In some embodiments, the normalization may be a linear normalization, where performance metrics fall proportionately within such a range according to the relative value of the performance metrics as compared to a maximum and minimum performance metric for the normalized area, like a field-of-view or the entire layout. In other embodiments, the normalization may be a nonlinear normalization, for example, a normalization based on an exponential or a logarithmic transformation of the performance metric, such that outlier values are either enhanced or suppressed in the visual representation relative to linear normalizations. In some embodiments, normalization may include comparing the performance metrics to a threshold and discarding or capping the value of performance metrics that fall below or above the threshold. For instance, some embodiments may either highlight or exclude performance metrics more than three standard deviations from a mean value of the performance metric, depending upon the use case and user selections.

In another example, some embodiments may combine multiple three or higher dimensional representations to generate the visualization. For example, some embodiments may determine for a first performance metric, which portions of the layout satisfy (e.g., exceed or fall under, depending upon the context) a particular threshold and mask (or selectively display) those portions of the layout in a visual representation of a second performance metrics.

In some embodiments, values of one performance metric in a particular area may be adjusted (e.g., proportionately or according to a model) based on values of another performance metric in that same portion of the layout. For example, some embodiments may attribute different portions of a total runtime for a particular segment to delays due to the algorithm, delays due to the design layout, and delays due to the hardware performance. Some embodiments may then subtract different permutations of these effects to reveal isolated effects or combinations of effects with different subsets.

For instance, some embodiments may determine that a particular patch with a particular runtime was processed while the computing hardware was overtaxed by another process executing on the same leaf server, thereby slowing down that particular patch. In response, some embodiments may adjust the visual indication of the runtime performance metric of that particular patch to appear less severe, as the cause is known and not due to the layout. In another example, some embodiments may adjust performance metrics based on a number of defects detected in the corresponding area, for example, down weighting certain performance metrics, like runtime to account for additional delays due to those defects. In another example, some embodiments may adjust performance metrics based on a density of features in the design layout portion being processed, for example, down weighting runtimes as density increases. A variety of different types of filters may be applied to add or subtract various effects, for example subtracting effects that are not amenable to troubleshooting, are already understood, or are intended consequences of the design.

In some embodiments, the resulting visualizations may be overlaid on a representation of the design layout, for example, as shown in FIG. 6. In some embodiments, the dimension corresponding to the performance metric may be expressed in a visual representation that is partially transparent to an underlying depiction of the design layout, or the design layout may be drawn over the visual representation of the performance metric. This is expected to facilitate troubleshooting efforts where analysts may infer expected or unexpected reasons for a particular performance metric that stand out based on the local design layout. In response, some analysts may take corrective action, for example, by adjusting the design layout, reconfiguring the computational process, troubleshooting computing hardware, and the like. In some embodiments, the analyst may rerun the computational analysis of the design layout after the change.

Figure 7:
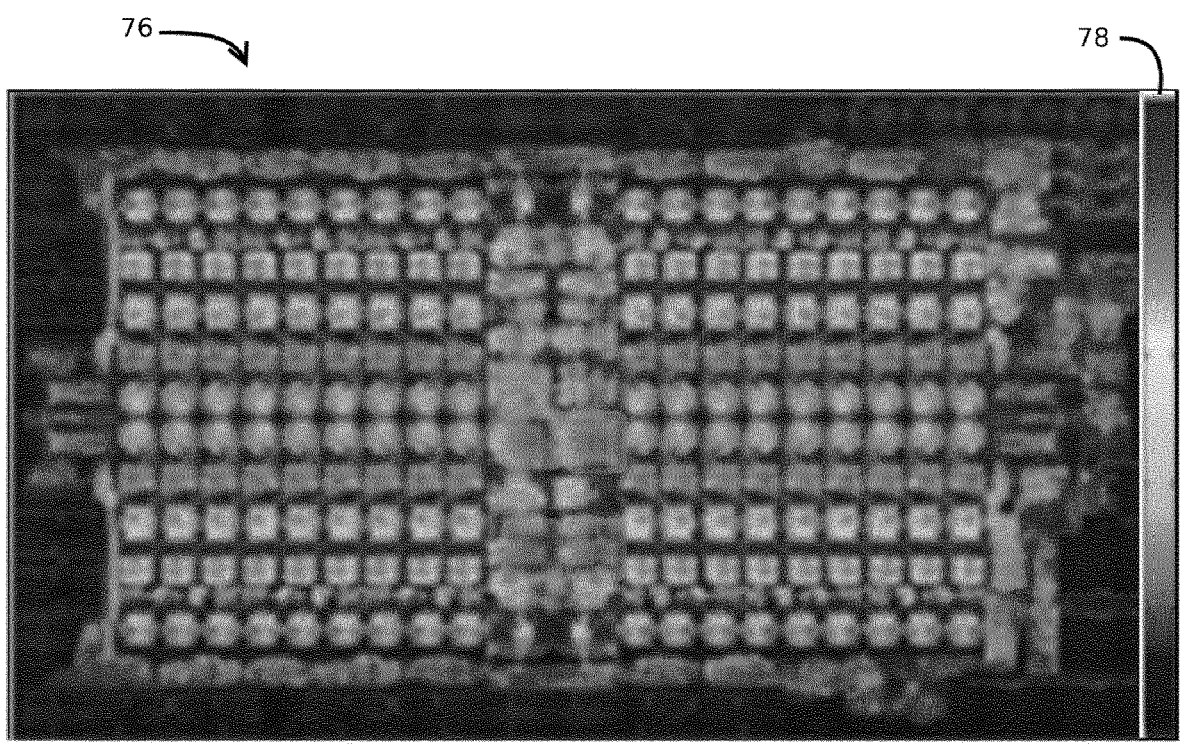
FIG. 7 is an example of a heat-map visualization of a full design layout.

In some embodiments, the resulting graphical visualization may be relatively granular as a result of relatively small patch or segment sizes. An example of such a graphical visualization 76 is shown in FIG. 7, which shows a heat map corresponding to an entire chip. As illustrated, certain regions of the chip may have performance metrics that correspond to the underlying design layout, and an analyst may infer from this heat map relatively quickly which areas of the design layout warrant further attention in troubleshooting. Some embodiments may include a legend 78 that correlates a gradient of visual attributes to performance metrics. The illustrated legend 78 may range from blue to red. Further, some embodiments may display the boundaries of patches, e.g., in virtue of the visual attributes varying between patches, or with boundaries overlayed on the visualization. Exposing the boundaries, e.g., in an area of non-conformity or unexpected output, may aid in troubleshooting, as an engineer may discern issues arising from boundary conditions.

In some embodiments, the unit area for which each performance metric is mapped may be substantially smaller than the unit area corresponding to an individual pixel on a display screen. Some embodiments may sample, calculate a measure of central tendency (e.g., mean, median or mode), or identify a max or min of unit areas corresponding to a pixel of a display screen to determine visual properties of the pixel depicting performance metrics. In some embodiments, the visual representation may be configured to receive various user inputs, such as zooming, panning, and the like, to explore this data, and some embodiments may render responsive displays. In some embodiments, to expedite rendering, the graphical representation may be precalculated according to different scales and stored in a pyramid file for relatively fast responses to user inputs requesting zooming or panning.

Figure 8:
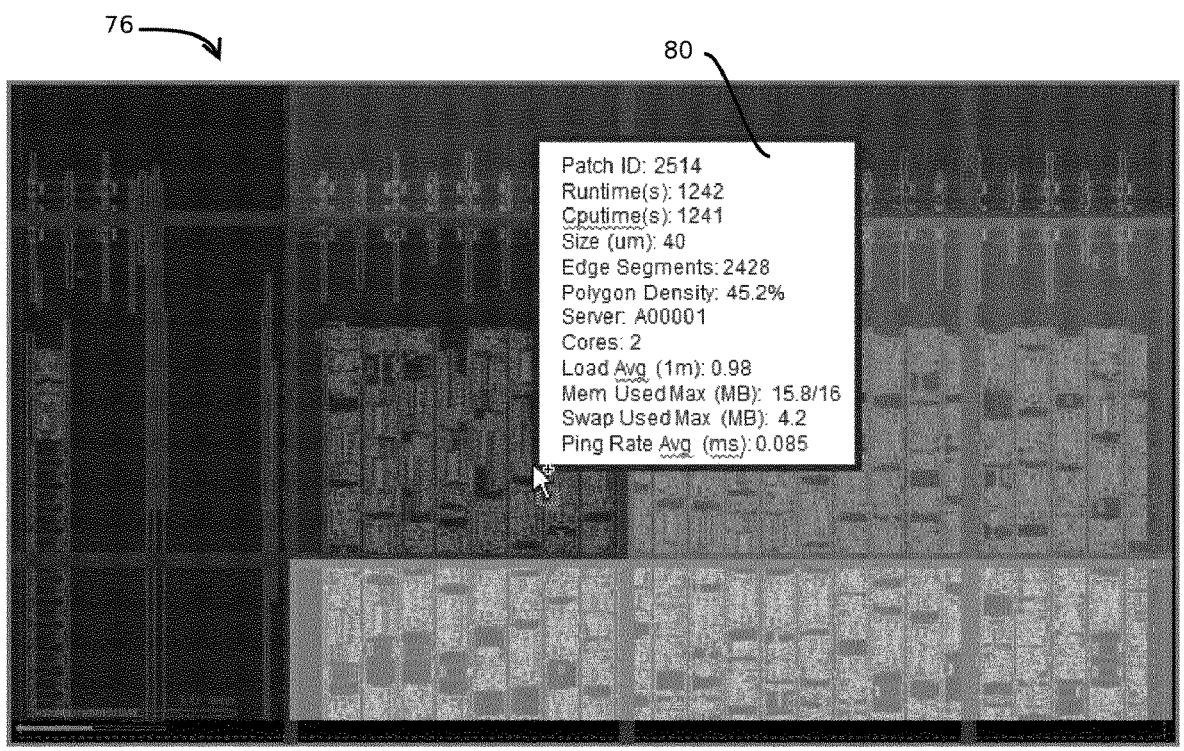
FIG. 8 is an example of a display prompted by a user selection of a portion of a heat-map visualization.

In some embodiments, the user may zoom in, as shown in FIG. 8, an enlarged portion of the version of the representation 76 of FIG. 7, showing relatively detailed design layouts overlaid by various patches having different performance metrics. In some embodiments, the different portions of the design layout may be user selectable, such that in response to a user selection, an event handler may retrieve the corresponding performance metrics of the respective portion of the design layout and display those performance metrics on the screen in a patch report 80, along with various others metrics of the portion of the design layout, like a density of segments, a polygon density, attributes of the computing hardware that processed the portion, and the like.

The present techniques are consistent with a wide variety of graphical representations. In some variants, the graphical representations include two spatial dimensions corresponding to the spatial dimensions of the design layout. In some embodiments, a third spatial dimension may be depicted in the graphical visualization, for example, in a surface plot showing the performance metric along a vertical axis relative to two orthogonal horizontal axes representing position on a design layout, e.g., in a perspective view. In other embodiments, the third performance metric dimension may be represented as a contour plot. Some embodiments may combine multiple performance metrics in a single graphical visualization, for instance, displaying a three-dimensional surface plot, with height representing one performance metric, color representing another performance metric, and transparency representing a third performance metric.

With the benefit of such visualizations, it is expected the analyst will be able to relatively quickly troubleshoot computational analyses of design layouts and reduce the cost of manufacturing integrated circuits, optical components, and microelectromechanical systems.

Figure 9:
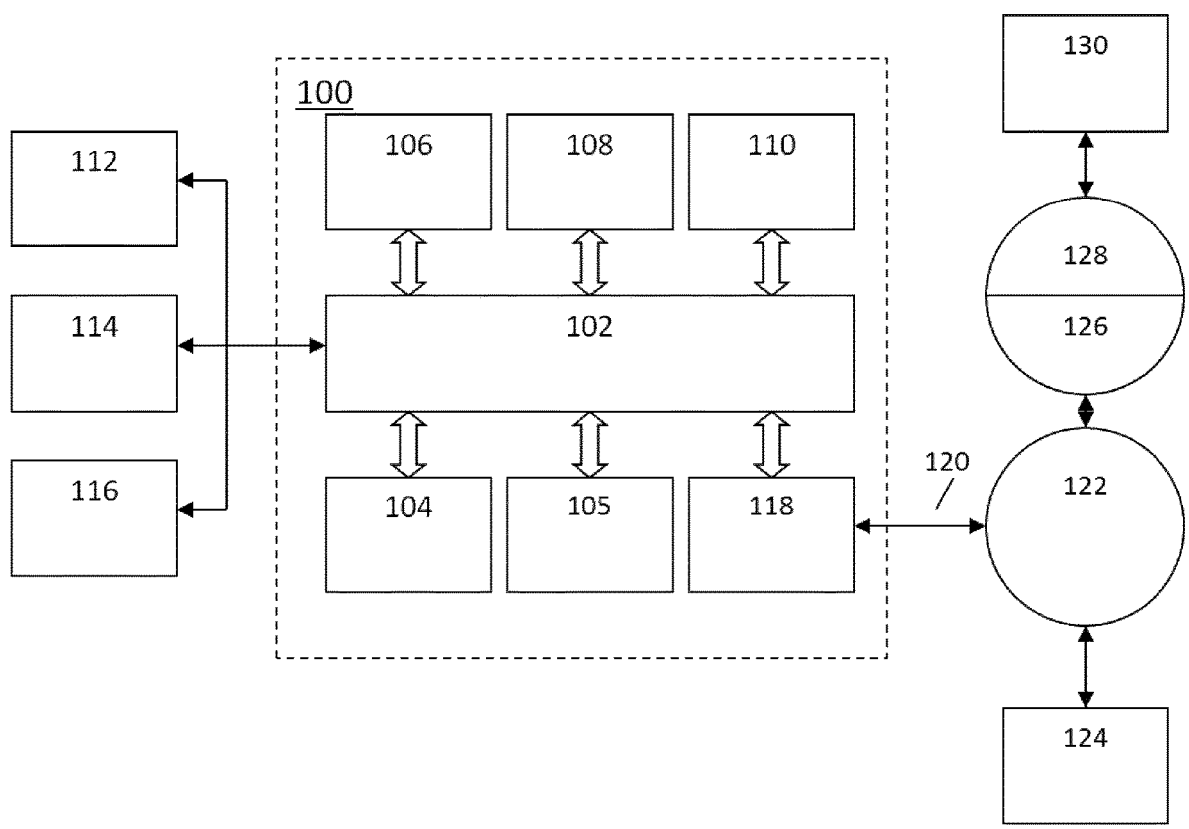
FIG. 9 is a block diagram of an example computer system.

FIG. 9 is a block diagram that illustrates a computer system 100 that may assist in implementing the simulation, characterization, and qualification methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. The computer need not be co-located with the patterning system to which an optimization process pertains. In some embodiments, the computer (or computers) may be geographically remote.

The term "computer-readable medium" as used herein refers to any tangible, non-transitory medium that participates in providing instructions to processor 104 for execution. Such a medium may take many forms, including non-volatile media and volatile media. Non-volatile media include, for example, optical or magnetic disks or solid state drives, such as storage device 110. Volatile media include dynamic memory, such as main memory 106. Transmission media include coaxial cables, copper wire and fiber optics, including the wires or traces that constitute part of the bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. In some embodiments, transitory media may encode the instructions, such as in a carrier wave.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 10:
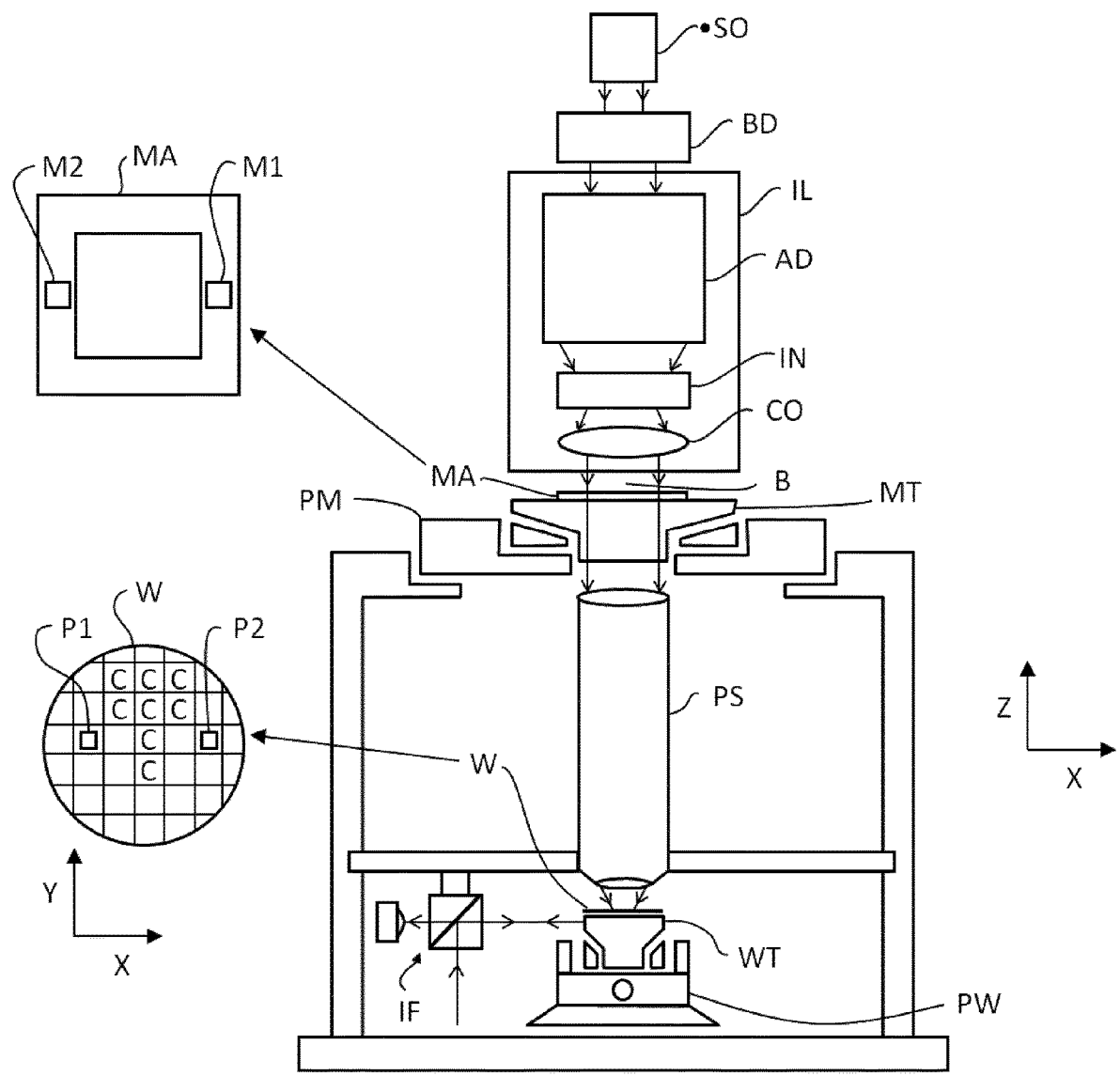
FIG. 10 is a schematic diagram of another lithography system.

FIG. 10 schematically depicts an exemplary lithographic projection apparatus whose process window for a given process may be characterized with the techniques described herein. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as -outer and -inner, respectively) of the intensity distribution in the beam. In addition, it will generally comprise various other components, such as an integrator IN and a condenser CO. In this way, the beam B impinging on the patterning device MA has a desired uniformity and intensity distribution in its cross section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 10. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 11:
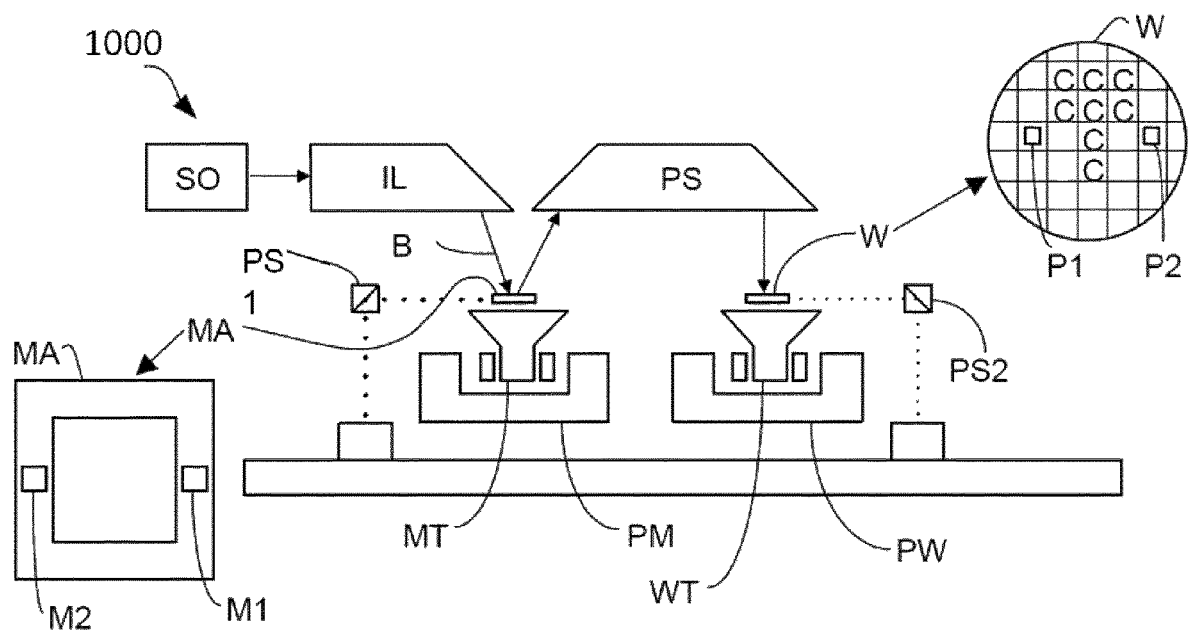
FIG. 11 is a schematic diagram of another lithography system.

FIG. 11 schematically depicts another exemplary lithographic projection apparatus 1000 whose process window for a given process may be characterized with the techniques described herein.

The lithographic projection apparatus 1000, in some embodiments, includes:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

As shown in FIG. 11, in some embodiments, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 11, for providing the laser beam exciting the fuel. The resulting plasma emits output radiation, e.g., EUV radiation, which is collected using a radiation collector, disposed in the source collector module. The laser and the source collector module may be separate entities, for example, when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may include an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted, in some embodiments. In addition, the illuminator IL may include various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device, in this example. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometer, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 may be used in at least one of the following modes:
1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.
3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that uses programmable patterning device, such as a programmable mirror array of a type as referred to above.

Figure 12:
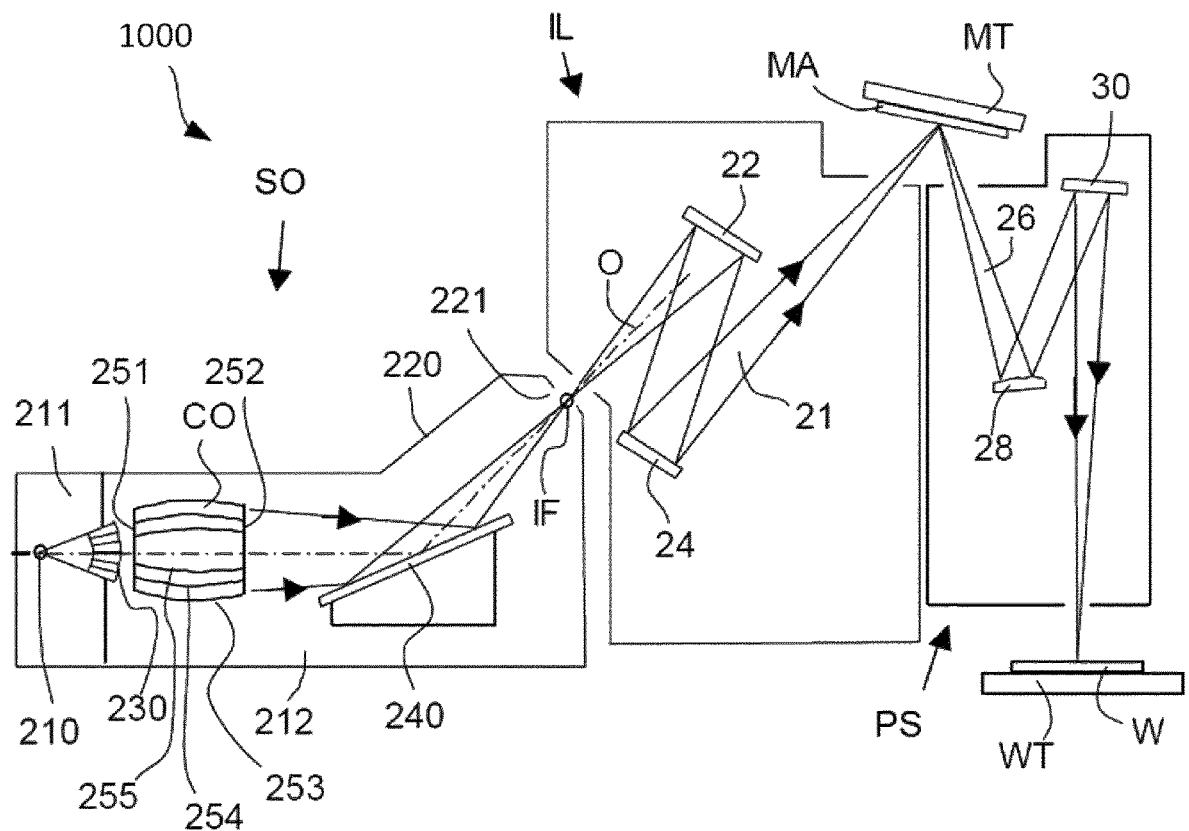
FIG. 12 is a more detailed view of the system in FIG. 11.

FIG. 12 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 13:
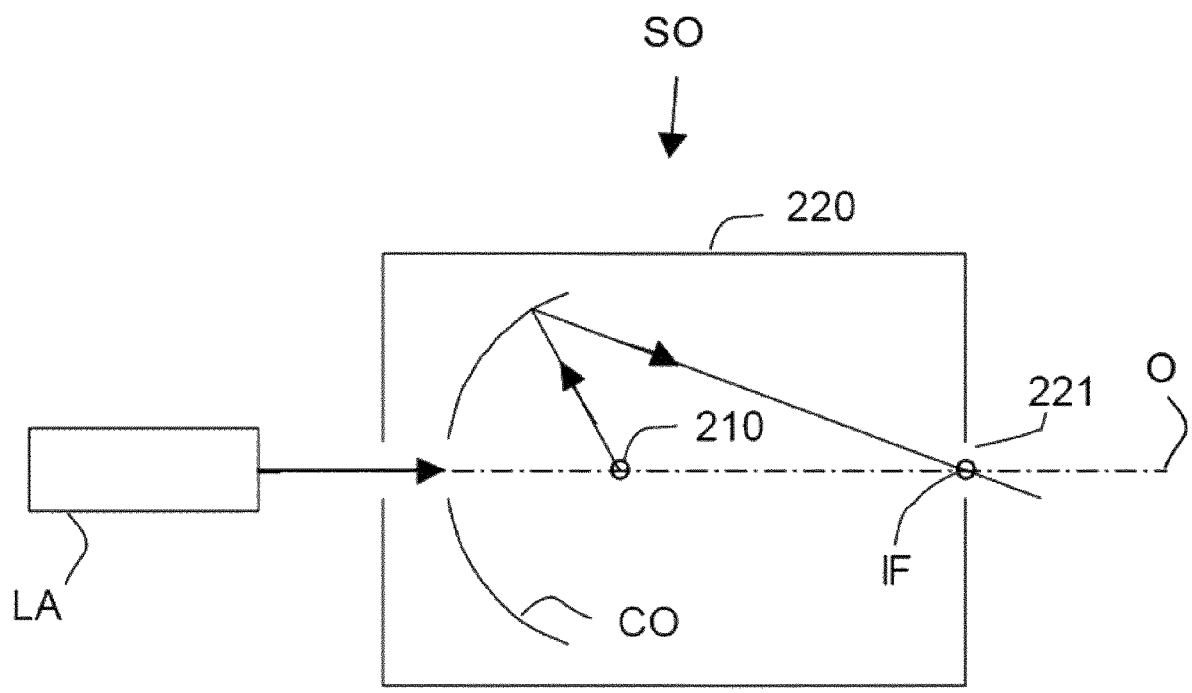
FIG. 13 is a more detailed view of the source collector module SO of the system of FIGS. 11 and 12.

Alternatively, the source collector module SO may be part of an LPP radiation system as shown in FIG. 13. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The present techniques will be better understood with reference to the following enumerated clauses:
1. A method, comprising: obtaining, with one or more processors, data specifying a layout of a lithographic pattern; obtaining, with one or more processors, performance metrics of a computational analysis of the layout, the performance metrics indicating performance of one or more computer processes performing respective portions of the computational analysis; correlating, with one or more processors, the performance metrics to portions of the layout being processed during measurement of the respective performance metrics; and generating, with one or more processors, a three or higher dimensional visualization based on a result of correlating the performance metrics to portions of the layout being processed during measurement, wherein at least some of the visualization dimensions indicate relative positions of portions of the layout and at least some of the visualization dimensions indicate a performance metric correlated to the respective portions.

2. The method of clause 1, wherein: the visualization comprises a heat-map visualization indicating which portions of the layout took longer to analyze in the computational analysis than other portions of the layout.

3. The method of clause 1, wherein: the visualization comprises a contour map.

4. The method of any of clauses 1-3, wherein: the visualization comprises a perspective view of a surface with three spatial dimensions.

5. The method of any of clauses 1-4, wherein: the visualization comprises a four or higher dimensional visualization of at least two performance metrics correlated to portions of the layout.

6. The method of any of clauses 1-5, wherein: the visualization comprises a multi-scale pyramid representation of an image.

7. The method of any of clauses 1-6, wherein: the visualization comprises users-selectable portions that are configured to display an amount of segments of the layout present in the portion upon being selected.

8. The method of any of clauses 1-7, comprising: determining an adjusted performance metric corresponding to a portion of the layout based on an amount or type of features of the layout in the respective portion.

9. The method of any of clauses 1-8, comprising: determining an adjusted performance metric corresponding to a portion of the layout that distinguishes algorithmic delays from computing hardware delays.

10. The method of any of clauses 1-9, comprising: generating another three or higher dimensional representation of another correlation to portions of the layout; and adjusting the visualization by combining the visualization with the other representation.

11. The method of clause 10, wherein combining the visualization with the other representation comprises: identifying which portions of the layout have values that satisfy a threshold in the other representation; and masking the identified portions of the visualization.

12. The method of clause 10, wherein the other representation correlates portions of the layout with defects in the layout.

13. The method of any of clauses 1-12, wherein the other representation indicates repetitions of regions within the layout, and wherein the combination indicates the repetitions in the visualization.

14. The method of any of clauses 1-13, wherein obtaining performance metrics of a computational analysis of the layout comprises obtaining log files generated by more than 100 processes executing on more than 100 processor cores, the log files indicating runtimes of analyses of portions of the layout being processed and hardware resource usage at the times the portions of the layout are processed.

15. The method of any of clauses 1-14, wherein: obtaining performance metrics of a computational analysis of the layout comprises steps for obtaining performance metrics; and correlating performance metrics to portions of the layout comprises steps for correlating performance metrics to portions of the layout.

16. The method of any of clauses 1-15, wherein: generating a three dimensional or higher visualization comprises steps for generating a visualization.

17. The method of any of clauses 1-16, wherein: the computational analysis comprises an optical proximity correction analysis.

18. The method of clause 17, wherein: the visualization comprises a heat-map in which runtimes of optimal proximity correction analyses of portions of the layout are normalized and mapped to colors indicating the normalized run-time durations for the respective portions, the portions being smaller than 2,000 square microns of the layout.

19. The method of any of clauses 1-18, comprising: adjusting the layout or the computational analysis based on the visualization; obtaining a mask layout based on the adjusted layout or a result of the adjusted analysis; and forming an integrated circuit, micro-mechanical device, or optical device with the mask.

20. A tangible, non-transitory, machine-readable medium storing instructions that when executed by a data processing apparatus cause the data processing apparatus to perform operations comprising: the operations of any of clauses 1-19.

21. A system, comprising: one or more processors; and memory storing instructions that when executed by the processors cause the processors to effectuate operations comprising: the operations of any of clauses 1-19.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X'ed items," used for purposes of making claims more readable rather than specifying sequence. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

In this patent, certain U.S. patents, U.S. patent applications, or other materials (e.g., articles) have been incorporated by reference. The text of such U.S. patents, U.S. patent applications, and other materials is, however, only incorporated by reference to the extent that no conflict exists between such material and the statements and drawings set forth herein. In the event of such conflict, the text of the present document governs.

The invention claimed is:

1. A method, comprising:
obtaining data specifying a layout of a lithographic pattern;
obtaining performance metrics of a computational analysis of the layout, the performance metrics indicating performance of one or more computer processes performing respective portions of the computational analysis;
correlating, by a hardware processor system, the performance metrics to portions of the layout, the portions of the layout being processed during a period for which the respective performance metrics are measured or determined; and
generating, by the hardware computer system, a multidimensional visualization based on a result of the correlating the performance metrics to portions of the layout being processed, wherein at least one of the visualization dimensions indicate relative positions of portions of the layout and at least one of the visualization dimensions indicate a performance metric correlated to the respective portions.

2. The method of claim 1, wherein the multidimensional visualization comprises a heat-map visualization indicating which one or more portions of the layout took longer to analyze in the computational analysis than one or more other portions of the layout, or wherein the multidimensional visualization comprises a contour map, or wherein the multidimensional visualization comprises a perspective view of a surface with three spatial dimensions, or wherein the multidimensional visualization comprises a three or higher dimensional visualization of at least two performance metrics correlated to portions of the layout, or wherein the multidimensional visualization comprises a multi-scale pyramid representation of an image, or wherein the multidimensional visualization comprises users-selectable portions that are configured to display an amount of segments of the layout present in the portion upon being selected.

3. The method of claim 1, further comprising determining an adjusted performance metric corresponding to a portion of the layout based on an amount or type of features of the layout in the respective portion.

4. The method of claim 1, further comprising determining an adjusted performance metric corresponding to a portion of the layout that distinguishes algorithmic delays from computing hardware delays.

5. The method of claim 1, further comprising:
generating another multidimensional representation of another correlation to portions of the layout; and
adjusting the multidimensional visualization by combining the multidimensional visualization with the other multidimensional representation.

6. The method of claim 5, wherein combining the multidimensional visualization with the other multidimensional representation comprises:

identifying which portions of the layout have values that satisfy a threshold in the other multidimensional representation; and masking the identified portions of the multidimensional visualization.

7. The method of claim 5, wherein the other multidimensional representation correlates portions of the layout with defects in the layout.

8. The method of claim 5, wherein the other multidimensional representation indicates repetitions of regions within the layout, and wherein the combination indicates the repetitions in the multidimensional visualization.

9. The method of claim 1, wherein obtaining performance metrics of a computational analysis of the layout comprises obtaining log files generated by more than 100 processes executing on more than 100 processor cores, the log files indicating runtimes of analyses of portions of the layout being processed and hardware resource usage at the times the portions of the layout are processed.

10. The method of claim 1, wherein:
obtaining performance metrics of a computational analysis of the layout comprises steps for obtaining performance metrics; and
correlating performance metrics to portions of the layout comprises steps for correlating performance metrics to portions of the layout.

11. The method of claim 1, wherein generating a multidimensional visualization comprises steps for generating a visualization.

12. The method of claim 1, wherein the computational analysis comprises an optical proximity correction analysis.

13. The method of claim 12, wherein the multidimensional visualization comprises a heat-map in which runtimes of optimal proximity correction analyses of portions of the layout are normalized and mapped to colors indicating the normalized run-time durations for the respective portions, the portions being smaller than 2,000 square microns of the layout.

14. The method of claim 1, comprising:
adjusting the layout or the computational analysis based on the multidimensional visualization;
obtaining a mask layout based on the adjusted layout or a result of the adjusted analysis; and
forming an integrated circuit, micro-mechanical device, or optical device with the mask layout.

15. A non-transitory computer-readable medium comprising instructions therein, the instructions, when executed by a computer system, configured to cause the computer system to at least:
obtain data specifying a layout of a lithographic pattern;
obtain performance metrics of a computational analysis of the layout, the performance metrics indicating performance of one or more computer processes performing respective portions of the computational analysis;
correlate the performance metrics to portions of the layout, the portions of the layout being processed during a period for which the respective performance metrics are measured or determined; and
generate a multidimensional visualization based on a result of the correlation of the performance metrics to portions of the layout processed, wherein at least one of the visualization dimensions indicate relative positions of portions of the layout and at least one of the visualization dimensions indicate a performance metric correlated to the respective portions.

16. The computer-readable medium of claim 15, wherein the multidimensional visualization comprises a heat-map visualization indicating which one or more portions of the layout took longer to analyze in the computational analysis than one or more other portions of the layout, or wherein the multidimensional visualization comprises a contour map, or wherein the multidimensional visualization comprises a perspective view of a surface with three spatial dimensions, or wherein the multidimensional visualization comprises a three or higher dimensional visualization of at least two performance metrics correlated to portions of the layout, or wherein the multidimensional visualization comprises a multi-scale pyramid representation of an image, or wherein the multidimensional visualization comprises users-selectable portions that are configured to display an amount of segments of the layout present in the portion upon being selected.

17. The computer-readable medium of claim 15, wherein the instructions are further configured to cause the computer system to determine an adjusted performance metric corresponding to a portion of the layout based on an amount or type of features of the layout in the respective portion.

18. The computer-readable medium of claim 15, wherein the instructions are further configured to cause the computer system to determine an adjusted performance metric corresponding to a portion of the layout that distinguishes algorithmic delays from computing hardware delays.

19. The computer-readable medium of claim 15, wherein the instructions are further configured to cause the computer system to:
generate another multidimensional representation of another correlation to portions of the layout; and
adjust the multidimensional visualization by combining the multidimensional visualization with the other multidimensional representation.

20. The computer-readable medium of claim 15, wherein the instructions configured to obtain performance metrics of a computational analysis of the layout are further configured to obtain log files generated by more than 100 processes executing on more than 100 processor cores, the log files indicating runtimes of analyses of portions of the layout being processed and hardware resource usage at the times the portions of the layout are processed.

* * * * *